US008810332B2

(12) United States Patent
Shirakawa et al.

(10) Patent No.: US 8,810,332 B2
(45) Date of Patent: Aug. 19, 2014

(54) ELECTROMAGNETIC COUPLER AND INFORMATION COMMUNICATION DEVICE WITH SAME MOUNTED THEREON

(75) Inventors: Yohei Shirakawa, Hitachi (JP); Naoto Teraki, Takahagi (JP); Kazuhiro Fujimoto, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 309 days.

(21) Appl. No.: 13/137,076

(22) Filed: Jul. 19, 2011

(65) Prior Publication Data

US 2012/0176208 A1 Jul. 12, 2012

(30) Foreign Application Priority Data

Jan. 7, 2011 (JP) ................................ 2011-002421

(51) Int. Cl.
*H03H 5/00* (2006.01)

(52) U.S. Cl.
USPC ........................................ 333/24 R; 333/101

(58) Field of Classification Search
USPC ................. 333/24 R, 101, 105, 262; 343/909
See application file for complete search history.

(56) References Cited

U.S. PATENT DOCUMENTS

| | | | | |
|---|---|---|---|---|
| 5,557,290 | A | 9/1996 | Watanabe | |
| 7,245,269 | B2 * | 7/2007 | Sievenpiper et al. | 343/909 |
| 7,541,979 | B2 | 6/2009 | Takei et al. | |
| 2006/0097932 | A1 | 5/2006 | Takei et al. | |
| 2008/0076351 | A1 | 3/2008 | Washiro | |

FOREIGN PATENT DOCUMENTS

| | | |
|---|---|---|
| JP | H4-199903 (A) | 7/1992 |
| JP | H6-260815 (A) | 9/1994 |
| JP | 2004-266500 (A) | 9/2004 |
| JP | 2006-121315 A | 5/2006 |
| JP | 2007-97115 (A) | 4/2007 |
| JP | 2008-85908 (A) | 4/2008 |
| JP | 2008-99236 A | 4/2008 |
| JP | 4345851 B2 | 10/2009 |

OTHER PUBLICATIONS

Misao Haneishi, et al. "Small Planar Antennas," The Institute of Electronics, Information and Communication Engineers, pp. 22-23.
Notification of Reason(s) for Refusal dated Jan. 24, 2014, with English translation.

* cited by examiner

*Primary Examiner* — Robert Pascal
*Assistant Examiner* — Kimberly Glenn
(74) *Attorney, Agent, or Firm* — McGinn IP Law Group, PLLC

(57) ABSTRACT

An electromagnetic coupler includes a first plane, a plurality of conductive patterns formed on the first plane and spaced apart from each other, a second plane parallel to the first plane, a ground pattern formed on the second plane and connected to ground, a first linear conductor formed to have a length shorter than ¼ a wavelength equivalent to a frequency used, the first linear conductor being connected at one end to one conductive pattern of the plural conductive patterns, and fed between an other end of the first linear conductor and the ground pattern, and a plurality of second linear conductors formed to have a length shorter than ¼ the wavelength equivalent to the frequency used, one or more of the second linear conductors being formed for each of the plural conductive patterns, to connect each of the plural conductive patterns and the ground pattern.

17 Claims, 12 Drawing Sheets

ELECTROMAGNETIC COUPLER AND INFORMATION COMMUNICATION DEVICE WITH SAME MOUNTED THEREON

The present application is based on Japanese patent application No. 2011-002421 filed on Jan. 7, 2011, the entire contents of which are incorporated herein by reference.

BACKGROUND OF THE INVENTION

1. Field of the Invention

This invention relates to an electromagnetic coupler, which is suitable for a wireless communication system for transmitting information using an electrostatic field or an induction electric field between information communication devices placed at a short distance from each other, and an information communication device with the electromagnetic coupler mounted thereon.

2. Description of the Related Art

JP Patent No. 4345851 discloses a conventional electromagnetic coupler. This electromagnetic coupler (high frequency coupler) is constructed by an electrode, a series inductor and a parallel inductor on a board being connected together by a high frequency transmission line. Also, the electromagnetic coupler is disposed in an information communication device such as a transmitter or a receiver. When these transmitter and receiver are arranged so that their respective electromagnetic coupler electrodes face each other, and when the distance between the two electrodes is not more than 2/15 the wavelength λ equivalent to the frequency used, the two electrodes are coupled together by an electrostatic field component of a longitudinal wave component of an electric field, to act as a single capacitance, and integrally as a bandpass filter, therefore allowing efficient information transmission between the two electromagnetic couplers. Also, when the distance between the two electrodes is from 2/15 to 8/15 the wavelength λ equivalent to the frequency used, an induction electric field component of the longitudinal wave component of the electric field is used, thereby allowing the information transmission between the two electromagnetic couplers.

On the other hand, when the distance between the electromagnetic couplers is longer than a constant value, the information transmission therebetween is impossible. This results in the feature that electromagnetic waves produced from the electromagnetic couplers do not interfere with any other wireless communication systems, and that a wireless communication system using the information communication devices equipped with the electromagnetic couplers is not subject to interference from any other wireless communication systems. Because of these features, the wireless communication system using the conventional electromagnetic couplers uses the electrostatic field or the induction electric field of the longitudinal wave at the short distances, and large capacities of data communications between the information communication devices are permitted by a UWB (Ultra Wide Band) communication method using wide band signals.

More specifically, in the electromagnetic coupler disclosed by JP Patent No. 4345851, a through hole formed in a columnar dielectric is filled with a conductor, while an upper end face of the columnar dielectric is formed with a conductor pattern to act as the electrode, and this columnar dielectric is mounted on the printed board formed with a conductor pattern to act as the high frequency transmission line, thereby connecting the high frequency transmission line and the electrode via the conductor in the through hole. The conductor in the through hole is used as an alternative to the above mentioned series inductor, and the high frequency transmission line is connected to a ground pattern via the parallel inductor. The electromagnetic coupler is configured so that information is transmitted therethrough by using the longitudinal wave of the electric field, which develops in a parallel direction to the conductor in the through hole (i.e. to electric current flowing through the conductor in the through hole), when this electromagnetic coupler is fed.

Refer to JP Patent No. 4345851, and JP-A-2006-121315, for example.

Refer also to Misao Haneishi, et al. "SMALL PLANAR ANTENNAS," The Institute of Electronics, Information and Communication Engineers, pp. 22-23, for example.

SUMMARY OF THE INVENTION

The electromagnetic coupler is built into e.g. PCs (personal computers), mobile phones, digital cameras, or the like, and used for transmitting or receiving data therebetween, such as moving images, etc. Because the electromagnetic coupler is built into small size devices such as mobile phones, digital cameras, or the like, it is required to be flat.

In order to flatten the electromagnetic coupler disclosed by JP Patent No. 4345851, however, the columnar dielectric needs to be shortened, and the conductor in the through hole is therefore short. When the conductor in the through hole is short, the electric field produced in the conductor in the through hole is small, and the longitudinal wave of the electric field used for information transmission is also small. There therefore arises the problem that the coupling strength between the transmitter electromagnetic coupler and the receiver electromagnetic coupler is small.

Also, since the coupling strength between the transmitter electromagnetic coupler and the receiver electromagnetic coupler is small, there arises the problem that when the distance therebetween is long, the information transmission is not possible, and that when the receiver electromagnetic coupler is slightly misaligned relative to the transmitter electromagnetic coupler, the information transmission therebetween is not possible.

More specifically, when the two electromagnetic couplers are disposed opposite and parallel to each other so that their respective centers form a straight line, and the straight line through the respective centers of both the electromagnetic couplers is taken as a Z axis in terms of Cartesian coordinates, if the distance between the two electromagnetic couplers is constant with reference to the Z axis, there is a negative correlation between the distance therebetween with reference to the X and Y axes, and the coupling strength therebetween. This is caused because, in wireless communication between the electromagnetic couplers using the longitudinal waves produced from their electrodes, the distance between the electrodes which are sources of the longitudinal waves increases with increasing distance with reference to the X and Y axes between the two electromagnetic couplers. For this, in the wireless communication using the two electromagnetic couplers, when the distance with reference to the above described X and Y axes between the two electromagnetic couplers is long, there arises the problem that their coupling strength is poor, and that the wireless communication is impossible in some cases.

Herein, when the distance with reference to the Z axis between the two electromagnetic couplers is constant, a possible range of the wireless communication with reference to the X and Y axes is termed a "coupling range." It is desirable that the electromagnetic couplers be wide in the coupling range, so that a slight positional misalignment thereof does not adversely affect the wireless communication.

Further, when the electromagnetic coupler disclosed by JP Patent No. 4345851 is flattened, its electrode is near to the ground, and its impedance characteristic (i.e. impedance versus frequency characteristic) therefore changes abruptly, whereas the input impedance of its feed system is constant. There therefore also arises the problem that the usable frequency band (i.e. the frequency band which is good in the matching condition between the electromagnetic coupler and the feed system) is narrow.

Also, in the electromagnetic coupler disclosed by JP Patent No. 4345851, when the distance between the respective electrodes of the two electromagnetic couplers is not more than 2/15 the wavelength λ equivalent to the frequency used, there is the problem that although information is efficiently transmitted therebetween by the realization of the bandpass filter, the signal transmission efficiency is poor in the case of the electromagnetic couplers being incompatible with each other.

Further, for example, when wireless communication is performed by mounting the electromagnetic coupler of JP Patent No. 4345851 inside the devices, because there are covers for the devices including a dielectric between the electromagnetic couplers, the permittivity therebetween varies. Consequently, there is the problem that the capacitance between the respective electrodes of the two electromagnetic couplers, and the frequency characteristic of the bandpass filter vary, and that, in some cases, the information transmission characteristics degrade in a desired frequency band. In this case, even if the electromagnetic couplers are designed taking account of the variation in the permittivity therebetween, when the wireless communication devices are further separate things, the permittivity between the electromagnetic couplers is a different value, and also the information transmission characteristics of the wireless communication degrade.

Also, in the electromagnetic coupler disclosed by JP Patent No. 4345851, when the distance between the respective electrodes of the two electromagnetic couplers is from 2/15 to 8/15 the wavelength λ equivalent to the frequency used, and when the information is transmitted using the induction electric field of the longitudinal wave, and fixing the arrangement and ambient environment of the two electromagnetic couplers, the information transmission characteristics depend on the matching condition between the electromagnetic coupler and the feed system. That is, when the matching condition is good, the signal strength from the electromagnetic coupler to a communication module including the feed system is high, but conversely, when the matching condition is poor, the signal strength from the electromagnetic coupler to the communication module including the feed system is low.

Thus, for the electromagnetic coupler of JP Patent No. 4345851, when the distance between the two electromagnetic couplers (i.e. the distance between their respective electrodes) is from 2/15 to 8/15 the wavelength λ equivalent to the frequency used, the electromagnetic coupler has to be designed to realize the bandpass filter, and improve the matching condition at the distance between the electromagnetic couplers of from 2/15 to 8/15 the wavelength λ equivalent to the frequency used. For this, for example when the signal strength is insufficient at the distance between the electromagnetic couplers of from 2/15 to 8/15 the wavelength λ equivalent to the frequency used, redesigning the electromagnetic coupler including realizing the bandpass filter at not more than 2/15 the wavelength λ equivalent to the frequency used is necessary and time consuming. Further, when the frequency band used is wide, realizing many frequencies suitable for the matching condition is necessary, therefore further making the designing time consuming.

Accordingly, it is an object of the present invention to provide an electromagnetic coupler, which overcomes the above problems and which achieves its larger coupling range while maintaining its coupling strength equivalent to conventional coupling strength, and an information communication device with the electromagnetic coupler mounted thereon.

Also, it is an object of the present invention to provide an electromagnetic coupler, which can, even when flattened, enhance its coupling strength, and widen its frequency band used, and an information communication device with the electromagnetic coupler mounted thereon.

Further, it is an object of the present invention to provide an electromagnetic coupler, whose information transmission characteristics are substantially not dependent on the permittivity between the electromagnetic couplers, while being maintained to be equivalent to conventional information transmission characteristics, and an information communication device with the electromagnetic coupler mounted thereon.

Further, it is an object of the present invention to provide an electromagnetic coupler, which can facilitate its feed system matching adjustment and frequency band adjustment, with its information transmission characteristics being maintained to be equivalent to conventional information transmission characteristics, and an information communication device with the electromagnetic coupler mounted thereon.

(1) According to one embodiment of the invention, an electromagnetic coupler comprises:

a first plane;

a plurality of conductive patterns formed on the first plane and spaced apart from each other;

a second plane parallel to the first plane;

a ground pattern formed on the second plane and connected to ground;

a first linear conductor formed perpendicularly to the first plane and the second plane, and formed to have a length shorter than 1/4 a wavelength equivalent to a frequency used, the first linear conductor being connected at one end to one conductive pattern of the plural conductive patterns, and fed between an other end of the first linear conductor and the ground pattern; and a plurality of second linear conductors formed perpendicularly to the first plane and the second plane, and formed to have a length shorter than 1/4 the wavelength equivalent to the frequency used, one or more of the second linear conductors being formed for each of the plural conductive patterns, to connect each of the plural conductive patterns and the ground pattern.

In one embodiment, the following modifications and changes can be made.

(i) The first plane is one surface of a printed board, the second plane is an other surface of the printed board, and the first linear conductor and the second linear conductors are conductors formed inside through holes, respectively, formed in the printed board.

(ii) The conductive pattern connected with the first linear conductor is formed in such a shape as to have a point symmetry with respect to a point connected with the first linear conductor, and a plurality of the second linear conductors are connected at such positions respectively as to have a point symmetry with respect to the first linear conductor in a plan view, to the conductive pattern connected with the first linear conductor.

(iii) The plural second linear conductors are formed at such positions respectively as to have a point symmetry with respect to the first linear conductor.

(iv) The plural conductive patterns are formed in such a shape as to have a point symmetry, and the plural second linear conductors are formed at such positions respectively as to have a point symmetry with respect to a symmetry point of the conductive patterns connected thereto.

(v) The plural conductive patterns comprise a first conductive pattern, which is square in a plan view, connected with the first linear conductor, and a second conductive pattern, which is formed in a square frame shape in the plan view to surround the first conductive pattern.

(vi) The plural conductive patterns comprise a first conductive pattern connected with the first linear conductor, and a plurality of second conductive patterns formed around the first conductive pattern, and the plural second conductive patterns are arranged at such positions respectively as to equally divide a circumference of a concentric circle having the first linear conductor at its center in its plan view as a reference point.

(vii) The plural conductive patterns comprise a first conductive pattern connected with the first linear conductor, and a plurality of second conductive patterns formed around the first conductive pattern, and the first conductive pattern and the plural second conductive patterns are aligned in such a manner that the center in the plan view of the first conductive pattern as a reference point, and the respective centers in the plan view of the plural second conductive patterns as reference points are aligned to form a straight line.

(viii) The electromagnetic coupler further comprises a coil to perform wireless communication by electromagnetic induction, the coil being arranged to surround the plural conductive patterns and the ground pattern in a plan view.

(ix) The electromagnetic coupler further comprises a coaxial cable for feeding between the other end of the first linear conductor and the ground pattern.

(2) According to another embodiment of the invention, an information communication device to transmit information by use of at least one of an electrostatic field and an induction electric field comprises an electromagnetic coupler mounted thereon, the electromagnetic coupler comprising:

a first plane;

a plurality of conductive patterns formed on the first plane and spaced apart from each other;

a second plane parallel to the first plane;

a ground pattern formed on the second plane and connected to ground;

a first linear conductor formed perpendicularly to the first plane and the second plane, and formed to have a length shorter than ¼ a wavelength equivalent to a frequency used, the first linear conductor being connected at one end to one conductive pattern of the plural conductive patterns, and fed between an other end of the first linear conductor and the ground pattern; and a plurality of second linear conductors formed perpendicularly to the first plane and the second plane, and formed to have a length shorter than ¼ the wavelength equivalent to the frequency used, one or more of the second linear conductors being formed for each of the plural conductive patterns, to connect each of the plural conductive patterns and the ground pattern.

In another embodiment, the following modifications and changes can be made.

(x) The first plane is one surface of a printed board, the second plane is an other surface of the printed board, and the first linear conductor and the second linear conductors are conductors formed inside through holes, respectively, formed in the printed board.

(xi) The conductive pattern connected with the first linear conductor is formed in such a shape as to have a point symmetry with respect to a point connected with the first linear conductor, and a plurality of the second linear conductors are connected at such positions respectively as to have a point symmetry with respect to the first linear conductor in a plan view, to the conductive pattern connected with the first linear conductor.

(xii) The plural second linear conductors are formed at such positions respectively as to have a point symmetry with respect to the first linear conductor.

(xiii) The plural conductive patterns are formed in such a shape as to have a point symmetry, and the plural second linear conductors are formed at such positions respectively as to have a point symmetry with respect to a symmetry point of the conductive patterns connected thereto.

(xiv) The plural conductive patterns comprise a first conductive pattern, which is square in a plan view, connected with the first linear conductor, and a second conductive pattern, which is formed in a square frame shape in the plan view to surround the first conductive pattern.

(xv) The plural conductive patterns comprise a first conductive pattern connected with the first linear conductor, and a plurality of second conductive patterns formed around the first conductive pattern, and the plural second conductive patterns are arranged at such positions respectively as to equally divide a circumference of a concentric circle having the first linear conductor at its center in its plan view as a reference point.

(xvi) The plural conductive patterns comprise a first conductive pattern connected with the first linear conductor, and a plurality of second conductive patterns formed around the first conductive pattern, and the first conductive pattern and the plural second conductive patterns are aligned in such a manner that the center in the plan view of the first conductive pattern as a reference point, and the respective centers in the plan view of the plural second conductive patterns as reference points are aligned to form a straight line.

(xvii) The information communication device further comprises a coil to perform wireless communication by electromagnetic induction, the coil being arranged to surround the plural conductive patterns and the ground pattern in a plan view.

(xviii) The information communication device further comprises a coaxial cable for feeding between the other end of the first linear conductor and the ground pattern.

Points of the Invention

According to one embodiment of the invention, an electromagnetic coupler is constructed such that it includes a second element not connected to a feed system as well as a first element connected to the feed system, and the second element includes a second linear conductor to radiate longitudinal wave components of electromagnetic waves, which are employed for wireless communication limited to short distance. Therefore, the wide range arrangement of the second linear conductor of the second element allows the wide range radiation of the longitudinal wave components of the electromagnetic waves. Thus, the electromagnetic coupler thus constructed can have the wide coupling range in comparison with the conventional electromagnetic coupler. Further, the addition of the second element causes no change in operating frequency of the first element. Therefore, it is possible to enlarge the coupling range without changing the operating frequency.

Accordingly, according to one embodiment of the invention, it is possible to provide an electromagnetic coupler, which overcomes the above problems and which achieves its larger coupling range while maintaining its coupling strength equivalent to conventional coupling strength, and an information communication device with the electromagnetic coupler mounted thereon.

Also, according to one embodiment of the invention, it is possible to provide an electromagnetic coupler, which can, even when flattened, enhance its coupling strength, and widen its frequency band used, and an information communication device with the electromagnetic coupler mounted thereon.

Further, according to one embodiment of the invention, it is possible to provide an electromagnetic coupler, whose information transmission characteristics are substantially not dependent on the permittivity between the electromagnetic couplers, while being maintained to be equivalent to conventional information transmission characteristics, and an information communication device with the electromagnetic coupler mounted thereon.

Further, according to one embodiment of the invention, it is possible to provide an electromagnetic coupler, which can facilitate its feed system matching adjustment and frequency band adjustment, with its information transmission characteristics being maintained to be equivalent to conventional information transmission characteristics, and an information communication device with the electromagnetic coupler mounted thereon.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Below are described the preferred embodiments according to the invention, in conjunction with the accompanying drawings.

Figure 1:
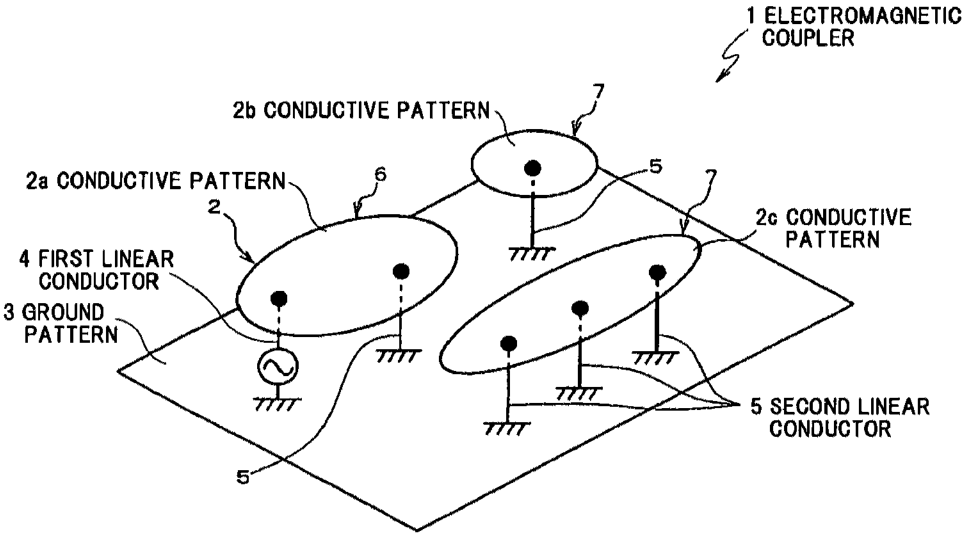
FIG. 1 is a diagram showing a concept of an electromagnetic coupler according to the invention.

FIG. 1 is a diagram showing a concept of an electromagnetic coupler 1 according to the invention.

As shown in FIG. 1, the electromagnetic coupler 1 according to the invention includes a plurality of conductive patterns 2 formed on a first plane and spaced apart from each other, a ground pattern 3 formed on a second plane parallel to the first plane and connected to ground, a first linear conductor 4 formed perpendicularly to the first and the second plane, connected at one end to one conductive pattern 2*a* of the plural conductive patterns 2, and fed between the other end of the first linear conductor 4 and the ground pattern 3, and a plurality of second linear conductors 5 formed perpendicularly to the first and the second plane, at least one or more of the second linear conductors 5 being formed for each of the plural conductive patterns 2, for connecting each of the plural conductive patterns 2 and the ground pattern 3. The first linear conductor 4 and the second linear conductors 5 are formed to have a length shorter than ¼ a wavelength equivalent to a frequency used.

In FIG. 1, the three conductive patterns 2*a* to 2*c* are shown as being included. The conductive pattern 2*a* is shown as being formed with the first linear conductor 4 and one second linear conductor 5. The conductive pattern 2*b* is shown as being formed with one second linear conductor 5. The conductive pattern 2*c* is shown as being formed with three second linear conductors 5. It should be noted, however, that the number of conductive patterns 2, or the number of second linear conductors 5 formed for each conductive pattern 2 is not limited thereto, but may appropriately be configured. Herein, the conductive pattern 2*a* formed with the first linear conductor 4 and one second linear conductor 5 is referred to as first element 6, and the conductive pattern 2*b* (or 2*c*) formed with one or more second linear conductors 5 (i.e. not formed with the first linear conductor 4 and not fed) is referred to as second element 7.

When the electromagnetic coupler 1 according to the invention is fed between the other end of the first linear conductor 4 and the ground pattern 3, electric current is produced in the first element 6. An appropriate selection of arrangement, position or shape of the second elements 7 allows the first element 6 and the second elements 7 to be electromagnetically coupled together, or the electric current flowing in the first element 6 to be transferred via the ground pattern 3 to the second elements 7, thereby resulting in electric current in the second elements 7 as well. The electric current is then produced in the second linear conductors 5 of each of the elements 6 and 7 as well. The electromagnetic coupler 1 according to the invention performs wireless communications by employing longitudinal wave components of electromagnetic waves produced mainly from the electric currents flowing in the second linear conductors 5 respectively.

With the electromagnetic coupler 1 according to the invention, it is possible to arrange in a wide range the second linear conductors 5 that act as sources to radiate the longitudinal wave components of the electromagnetic waves respectively. A greater coupling range is therefore feasible.

First Embodiment

Figure 2A:
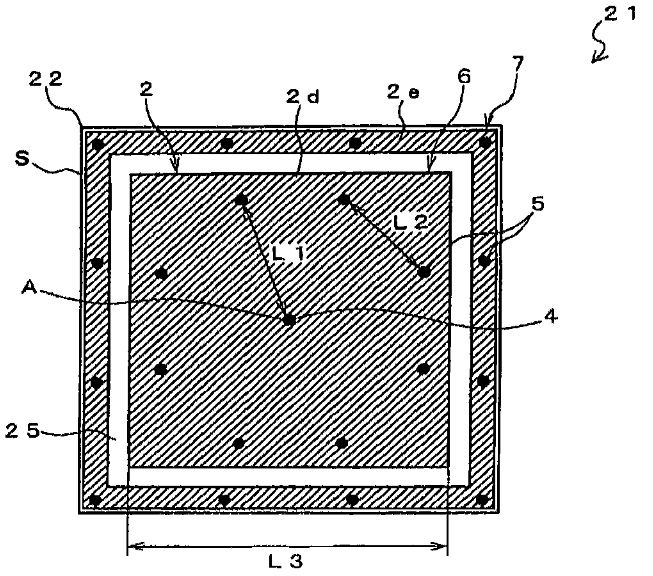
FIG. 2A is a plan view showing an electromagnetic coupler in a first embodiment according to the invention, when viewed from a surface side thereof.
Figure 2B:
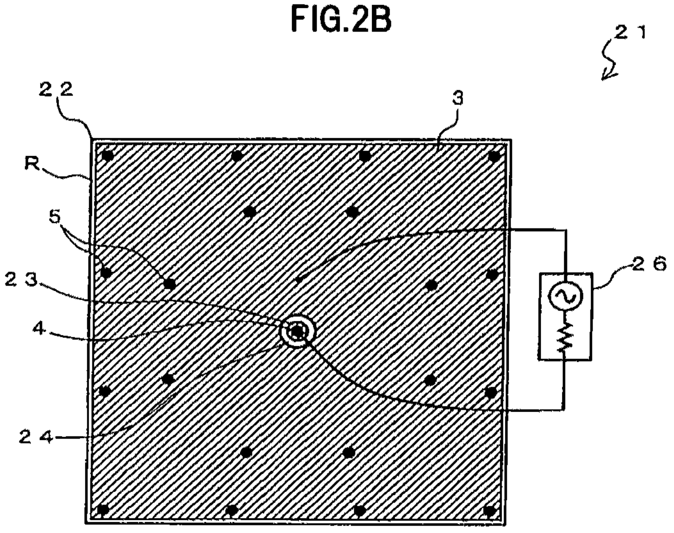
FIG. 2B is a plan view showing the electromagnetic coupler of FIG. 2A, when the reverse side thereof is seen through from the surface side thereof.

Referring to FIGS. 2A and 2B, there is shown an electromagnetic coupler 21 in a first embodiment according to the invention.

As shown in FIGS. 2A and 2B, the electromagnetic coupler 21 in the first embodiment uses a double layer printed board 22, which may be formed with wiring patterns on both its surfaces, and one surface (or first layer, herein also referred to as "surface") S of the printed board 22 is formed with two conductive patterns 2, while an other surface (or second layer, herein also referred to as "reverse surface") R of the printed board 22 is formed with a ground pattern 3. That is, the previously mentioned first plane is the surface S of the printed board 22, while the previously mentioned second plane is the reverse surface R of the printed board 22. The printed board 22 described herein uses a square FR 4 (Flame Retardant Type 4) glass epoxy printed board.

In the electromagnetic coupler 21, a middle portion of the reverse surface R of the printed board 22 is formed with a feed pattern 23 which is circular in the plan view, and the ground pattern 3 is provided to surround the feed pattern 23 in such a manner as to have an air gap 24 therebetween formed around the feed pattern 23, and is formed in a square shape in the plan view to cover the entire reverse surface R of the printed board 22 around the feed pattern 23.

In the electromagnetic coupler 21, the two conductive patterns 2 comprise a conductive pattern (first conductive pattern) 2*d*, which is square in the plan view, formed in a middle portion of the surface S of the printed board 22, and a conductive pattern (second conductive pattern) 2*e*, which is provided to surround the conductive pattern 2*d* in such a manner as to have an air gap 25 therebetween formed around the conductive pattern 2*d*, and which is formed in a square frame shape in the plan view. The conductive pattern 2*d* is formed to face the feed pattern 23 and the ground pattern 3, while the conductive pattern 2*e* is formed to face the ground pattern 3.

The first linear conductor 4 and the plural second linear conductors 5 are formed perpendicularly to the surface S and the reverse R of the printed board 22. These linear conductors 4 and 5 are conductors formed inside through holes respectively (not shown) formed in the printed board 22. These conductors may fill in the through holes respectively, or be also provided thinly on inner surfaces of the through holes respectively.

The first linear conductor 4 is connected at one end to the center (reference center) in the plan view of the feed pattern 23, and at the other end to the center (reference center) in the plan view of the square conductive pattern 2*d*. This results in electrical connection of the feed pattern 23 and the conductive pattern 2*d* via the first linear conductor 4. The conductive pattern 2*d* is shaped to have a point symmetry with respect to a point A connected with the first linear conductor 4.

The square conductive pattern 2*d* is formed with the eight second linear conductors 5. These second linear conductors 5 are connected at one end to the ground pattern 3, and at the other end to the conductive pattern 2*d*. This results in electrical connection of the ground pattern 3 and the conductive pattern 2*d* via the second linear conductors 5.

The eight second linear conductors 5 formed for the square conductive pattern 2*d* are formed at such positions respectively as to have a point symmetry with respect to the first linear conductor 4 in the plan view. In the first embodiment, for each of the four sides of the square conductive pattern 2*d*, two of the second linear conductors 5 are formed adjacent thereto. These eight second linear conductors 5 are formed at such positions respectively as to have a point symmetry, and be vertically and horizontally symmetric with respect to the first linear conductor 4 in the plan view. Also, the eight second linear conductors 5 are formed in such a manner that the distances from the connected point A of the conductive pattern 2*d* and the first linear conductor 4 to the connected points of the conductive pattern 2*d* and the second linear conductors 5 are all equal to L1.

When the printed board 22 used has a relative permittivity of 4.0 to 5.0, and when the wavelength equivalent to the frequency used is λ, the thickness T of the printed board 22 is set at 6λ/1000 to 45λ/1000. Also, the distance L1 from the connected point A of the conductive pattern 2*d* and the first linear conductor 4 to the connected points of the conductive pattern 2*d* and the second linear conductors 5 is set at 75λ/1000 to 225λ/1000, and the conductive pattern 2*d* is formed in a square shape having a length L3 of one side of 225λ/1000 to 450λ/1000. Further, the shortest distance L2 between the two second linear conductors 5 provided adjacent to one side of the conductive pattern 2*d* and the two second linear conductors 5 provided adjacent to its next side is set at 75λ/1000 to 225λ/1000. Each of these dimensions is necessary in order to achieve an input impedance suitable for the matching condition of the electromagnetic coupler 21.

The power feed from a feed system 26 to the electromagnetic coupler 21 may be performed by means of a coaxial cable, for example. A central conductor of the coaxial cable is connected to the feed pattern 23, while an outer conductor of the coaxial cable is connected to the ground pattern 3.

Incidentally, although in the first embodiment it has been described that for each of the four sides of the square conductive pattern 2*d*, two of the second linear conductors 5 are formed adjacent thereto so that the total eight second linear conductors 5 are formed for the conductive pattern 2*d*, the number or arrangement of the second linear conductors 5 is not limited thereto. Also, although in the first embodiment it has been described that the conductive pattern 2*d* is formed in a square shape, the conductive pattern 2*d* may be shaped to have a point symmetry with respect to the point A connected with the first linear conductor 4, and may, taking account of the input immittance frequency characteristic and the coupling range, be shaped into another shape such as a circle, a polygon or the like. The input immittance frequency characteristic of the electromagnetic coupler 21 depends on the shape of the conductive pattern 2*d*, and the arrangement, position, number, diameter or the like of the second linear conductors 5 relative to the conductive pattern 2*d*. An appropriate selection thereof allows the realization of the electromagnetic coupler 21 having the desired input immittance frequency characteristic.

The square frame shaped conductive pattern 2*e* formed around the conductive pattern 2*d* is formed with total twelve second linear conductors 5 at an equal pitch, one for each of its four corners, and two for each of its four sides. These second linear conductors 5 are connected at one end to the ground pattern 3, and at the other end to the conductive pattern 2*e*. This results in electrical connection of the ground pattern 3 and the conductive pattern 2*e* via the second linear conductors 5.

The twelve second linear conductors 5 formed for the square frame shaped conductive pattern 2*e* are formed at such positions respectively as to have a point symmetry, and be vertically and horizontally symmetric with respect to the first linear conductor 4 in the plan view. That is, in the first embodiment, all the second linear conductors 5 are formed at such positions respectively as to have a point symmetry, and be vertically and horizontally symmetric with respect to the first linear conductor 4.

Also, the conductive pattern 2*e* is formed in such a shape as to have a point symmetry with respect to the connected point A of the conductive pattern 2*d* and the first linear conductor 4, and the twelve second linear conductors 5 formed for the square frame shaped conductive pattern 2*e* are formed at such positions respectively as to have a point symmetry with respect to the symmetry point of the conductive pattern 2*e* as well.

Operation and Advantages of the Electromagnetic Coupler 21

Operation and advantages of the electromagnetic coupler 21 are described.

Figure 3:
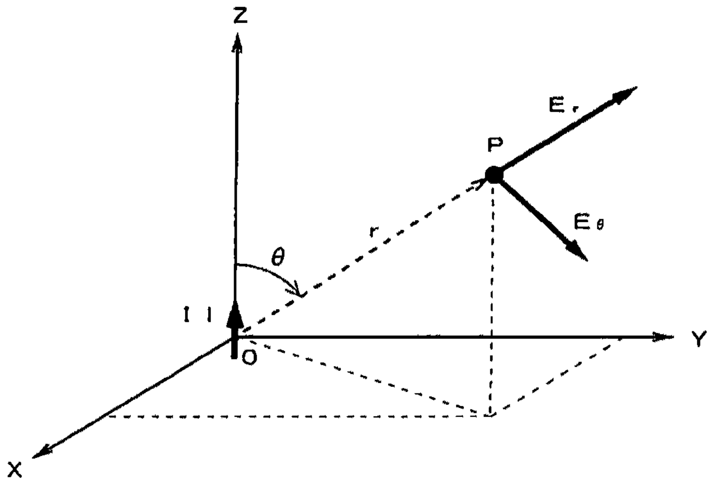
FIG. 3 is a diagram for explaining a longitudinal wave and a transverse wave of an electric field according to the invention.

Referring to FIG. 3, an electric field produced from a small dipole (Il) has a longitudinal wave Er and a transverse wave $E_\theta$. The longitudinal wave Er is expressed by Formula (1) shown below.

$$E_r = \frac{Il}{2\pi}\exp(-jk_0r)\left\{\frac{n_0}{r^2} + \frac{1}{jw\varepsilon_0 r^3}\right\}\cos\theta \tag{1}$$

The transverse wave $E_\theta$ is expressed by Formula (2) shown below.

$$E_\theta = \frac{Il}{4\pi}\exp(-jk_0r)\left\{\frac{jw\mu_0}{r} + \frac{n_0}{r^2} + \frac{1}{jw\varepsilon_0 r^3}\right\}\sin\theta \tag{2}$$

Here, Il denotes the small dipole passing through the origin O and lying in the Z axis. $n_o$ denotes the characteristic impedance, $E_r$ denotes a longitudinal wave at an observation point P, $E_\theta$ denotes a transverse wave at the observation point P, r denotes the distance from the small dipole Il, $k_o$ denotes the wave number, j denotes the imaginary unit, w denotes the angular frequency, $\in_o$ denotes the vacuum permittivity, $\mu_o$ denotes the vacuum permeability, and θ denotes the angle that the observation point P makes with the Z axis (the small dipole Il).

Figure 4:
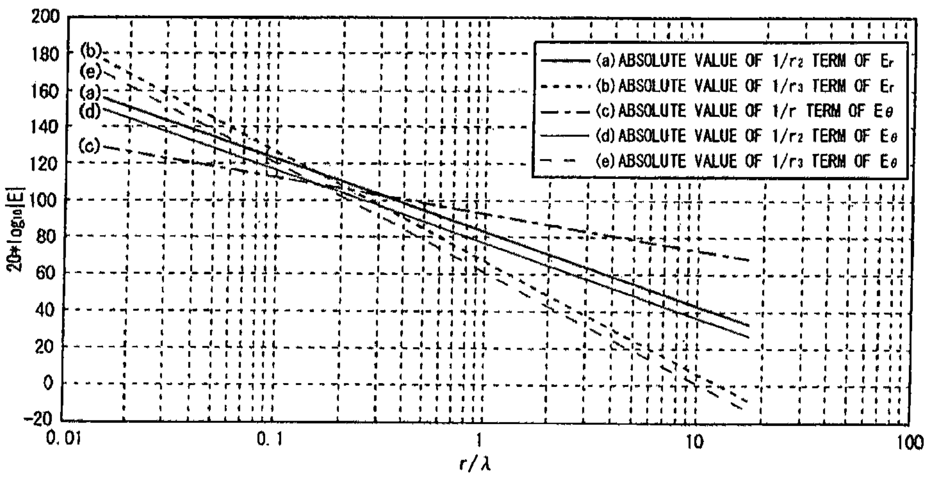
FIG. 4 is a graph showing the relationship between the distance to electric field wavelength ratio (r/λ) and the electric field strength according to the invention.

Referring to FIG. 4, there is shown the relationship between the distance to electric field wavelength ratio (r/λ) and the electric field strength calculated from Formulae (1) and (2). In FIG. 4, the horizontal axis shows the distance to electric field wavelength ratio (r/λ) and the vertical axis shows the logarithm of the electric field strength. In FIG. 4, there are shown five electric field components:

(a) the absolute value of the $1/r^2$ term of the longitudinal wave $E_r$ (b) the absolute value of the $1/r^3$ term of the longitudinal wave $E_r$ (c) the absolute value of the $1/r^1$ term of the transverse wave $E_\theta$ (d) the absolute value of the $1/r^2$ term of the transverse wave $E_\theta$ (e) the absolute value of the $1/r^3$ term of the transverse wave $E_\theta$ In Formulae (1) and (2) and FIG. 4, the component inversely proportional to the distance r is the radiation electric field, the component inversely proportional to the square of the distance r is the induction electric field, and the component inversely proportional to the cube of the distance r is the electrostatic field. The transverse wave $E_\theta$ is composed of the radiation electric field, the induction electric field, and the electrostatic field, whereas the longitudinal wave Er is composed of only the induction electric field and the electrostatic field.

Since the radiation electric field is inversely proportional to the distance r, the radiation electric field reaches longer distance without attenuation in comparison with the induction electric field or the electrostatic field inversely proportional to the square or cube of the distance r, and may therefore act as an interfering wave with other systems. Thus, the electromagnetic coupler transmits information by employing the longitudinal wave Er, which does not contain the radiation electric field component, while suppressing the transverse wave $E_\theta$.

As mentioned above, because of having no 1/r term, the longitudinal wave $E_r$ has the feature of attenuating significantly with distance, and therefore not reaching long distance, in comparison with the transverse wave $E_\theta$. The electromagnetic coupler employs this feature to achieve wireless communication limited to short distance.

The electromagnetic coupler 21 according to the invention also positively employs the longitudinal waves $E_r$ ((a) and (b) in FIG. 4) produced from electric currents distributed over the second linear conductors 5 respectively, to achieve wireless communication equivalent to the conventional art.

Specifically, in the electromagnetic coupler 21 in the first embodiment, by power being fed from the feed system 26 to the electromagnetic coupler 21, electric current flows in the first element 6, and from currents flowing in the second linear conductors 5, respectively, constituting the first element 6, longitudinal wave components of electric fields are radiated parallel to the second linear conductors 5, respectively, (perpendicularly to the conductive pattern 2*d*). The magnitude of the longitudinal wave components is positively correlated with the matching condition between the electromagnetic coupler 21 and the feed system 26.

When the current flows in the first element 6, the second element 7 is electromagnetically coupled to the first element 6, or the current flowing in the first element 6 is transferred via the ground pattern 3 to the second element 7, thereby also resulting in electric current flowing in the second element 7, and longitudinal wave components of electric fields being radiated from the second linear conductors 5, respectively, constituting the second element 7.

In this manner, although the electromagnetic coupler 21 is operable even with only the first element 6, the further addition of the second element 7 around that first element 6 allows the wider range distribution of the second linear conductors 5 which are the sources of the longitudinal waves, thereby enlarging the coupling range.

Incidentally, although the coupling range is considered to be enlarged by enlarging the first element 6 size itself (conductive pattern 2*d* area), because the alteration of the first element 6 size causes variation in operating frequency, there is a limit to the enlargement of the first element 6 size. The invention allows the coupling range to be enlarged without variation in operating frequency, by adding the second element 7 around the first element 6.

It should be noted, however, that because when the conductive pattern 2*d* of the first element 6 and the conductive pattern 2*e* of the second element 7 are too close to each other, the operating frequency of the first element 6 varies due to capacitive coupling of the conductive patterns 2*d* and 2*e*, the conductive pattern 2*d* of the first element 6 and the conductive pattern 2*e* of the second element 7 need to be spaced apart in such a manner as to be unaffected by the capacitive coupling thereof.

Incidentally, because the electromagnetic coupler 21 is formed with the second linear conductors 5 constituting the first element 6 at such positions respectively as to have a point symmetry with respect to the first linear conductor 4 in the plan view, the electric currents flowing in the conductive pattern 2*d* have the same magnitude and opposite directions, so that the transverse waves produced in the conductive pattern 2*d* cancel each other out.

Also, because the electromagnetic coupler 21 is formed with the second linear conductors 5 constituting the second element 7 at such positions respectively as to have a point symmetry with respect to the symmetry point of the conductive pattern 2*e*, and have a point symmetry with respect to the first linear conductor 4, the transverse waves produced in the conductive pattern 2*e* also cancel each other out.

Further, as described in detail later, the electromagnetic coupler 21 allows the length of the second linear conductors 5 (i.e. the thickness T of the printed board 22) to be shortened (reduced) to e.g. 1 mm or less, and therefore transverse waves which are electric fields produced perpendicularly to the second linear conductors 5 to be small.
Accordingly, it is possible to suppress the transverse waves including the radiation electric field acting as an interfering wave with other systems.

Incidentally, although when the length of the second linear conductors 5 is shortened, the longitudinal waves produced in the second linear conductors 5 are also small, because the electromagnetic coupler 21 is formed with the plural (herein, total twenty) second linear conductors 5, an increase of the number of second linear conductors 5 which are the sources of the longitudinal waves allows the longitudinal waves produced in the entire electromagnetic coupler 21 to be maintained in magnitude, and held at a high coupling strength.

Also, when the distance between the conductive pattern 2*d* and the ground pattern 3 is short, there arises the problem that the impedance characteristic changes abruptly, and the usable frequency band is therefore narrow. In the electromagnetic coupler 21 according to the invention, however, because the conductive pattern 2*d* and the ground pattern 3 are electrically connected together by the second linear conductors 5, these second linear conductors 5 act as so called shorting stubs to make the impedance characteristic change gradual, thereby allowing the usable frequency band to be widely maintained, even when the distance between the conductive pattern 2*d* and the ground pattern 3 is short.

For example, in the electromagnetic coupler disclosed by JP Patent No. 4345851, its electrode is not grounded. The electromagnetic coupler of JP Patent No. 4345851 can be referred to as "open stub" electromagnetic coupler. According to JP-A-2006-121315, the input admittance Y in the open stub can be expressed by Formula (3) shown below.

$$Y = Y_O\tanh(\gamma l) = Y_O\tanh(\alpha\beta l + j\beta l) = Y_O\frac{\sinh 2\alpha\beta l + j\sin 2\beta l}{\cosh 2\alpha\beta l + \cos 2\beta l} = Y_O\frac{\sinh\alpha\theta + j\sin\theta}{\cosh\alpha\theta + \cos\theta} \tag{3}$$

where $\theta = 2\beta l$

Also, for $0<\alpha\theta<<1$, $\theta=(2m-1)\pi+\delta\theta$, and $|\delta\theta|<<1$, Formula (3) can be approximated by Formula (4) shown below.

$$Y \approx Y_O\frac{\alpha\theta - j\{\theta-(2m-1)\pi\}}{1+\frac{(\alpha\theta)^2}{2}-1+\frac{\{\theta-(2m-1)\pi\}^2}{2}} \approx 2Y_O\frac{\alpha\theta - j\{\theta-(2m-1)\pi\}}{(\alpha\theta)^2+\{\theta-(2m-1)\pi\}^2} \tag{4}$$

Here, $Y_o$ denotes the characteristic admittance, α denotes a loss constant, β denotes the wave number, l denotes the electrical length, and m denotes a positive integer. Incidentally, m=1 is used because it is desirable that the electromagnetic coupler be small in size.

From Formula (4), for around $\theta=(2m-1)\pi$, the real component of the input admittance Y in the open stub is the extreme value, and its imaginary component is zero.

In the electromagnetic coupler 21 according to the invention, on the other hand, the conductive pattern 2*d* is connected to ground. The electromagnetic coupler 21 can be referred to as "shorting stub" electromagnetic coupler. According to JP-A-2006-121315, the input admittance Y in the shorting stub can be expressed by Formula (5) shown below.

$$Y = Y_O\coth(\gamma l) = Y_O\coth(\alpha\beta l + j\beta l) = Y_O\frac{\sinh 2\alpha\beta l - j\sin 2\beta l}{\cosh 2\alpha\beta l - \cos 2\beta l} = Y_O\frac{\sinh\alpha\theta - j\sin\theta}{\cosh\alpha\theta - \cos\theta} \tag{5}$$

where $\theta = 2\beta l$

Also, for $0<\alpha\theta<<1$, $\theta=2m\pi+\delta\theta$, and $|\delta\theta|<<1$, Formula (5) can be approximated by Formula (6) shown below.

$$Y \approx Y_O \frac{\alpha\theta - j(\theta - 2m\pi)}{1 + \frac{(\alpha\theta)^2}{2} - 1 + \frac{(\theta - 2m\pi)^2}{2}} \approx 2Y_O \frac{\alpha\theta - j(\theta - 2m\pi)}{(\alpha\theta)^2 + (\theta - 2m\pi)^2} \quad (6)$$

From Formula (6), for around $\theta=2m\pi$, the real component of the input admittance Y in the shorting stub is the extreme value, and its imaginary component is zero.

In comparison of Formulae (4) and (6), the gradient with respect to $\theta$ of the real and imaginary components of the input admittance Y is smaller in Formula (6) representing the input admittance Y in the shorting stub. Thus, in comparison with the conventional open stub electromagnetic coupler, the shorting stub electromagnetic coupler 21 according to the invention makes the impedance characteristic change gradual, thereby allowing the usable frequency band to be widely maintained, even when the distance between the conductive pattern 2*d* and the ground pattern 3 is short.

Figure 5A:
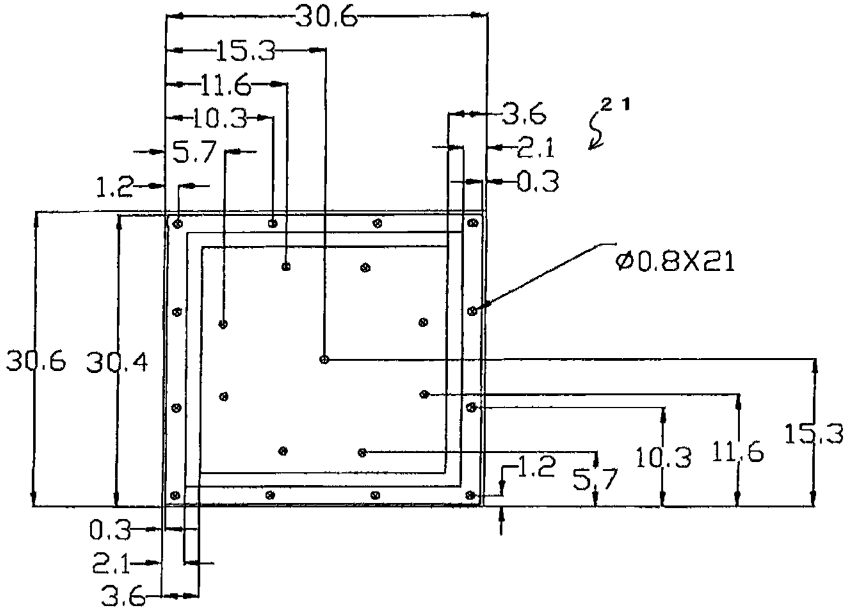
FIG. 5A is a diagram showing one example of dimensions in the electromagnetic coupler of FIG. 2A.
Figure 5B:
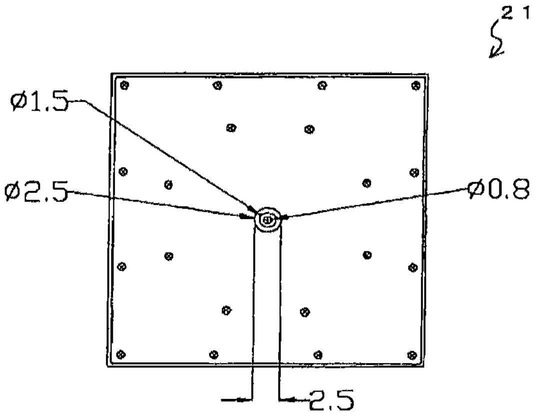
FIG. 5B is a diagram showing one example of dimensions in the electromagnetic coupler of FIG. 2B.
Figure 6:
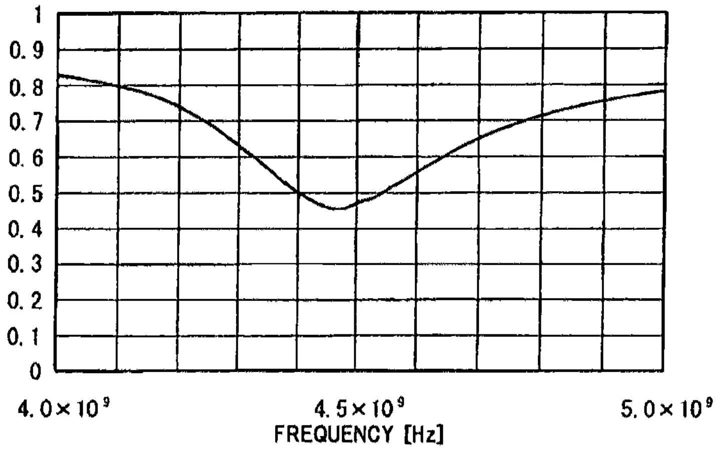
FIG. 6 is a diagram showing an experimental result of the relationship between the frequency and the reflection coefficient absolute value of the electromagnetic coupler shown in FIGS. 2A and 2B.

Referring to FIG. 6, there is shown an experimental result of investigating the relationship between the frequency and the reflection coefficient absolute value of the electromagnetic coupler 21. In this experiment, the electromagnetic coupler 21 shaped as shown in FIGS. 5A and 5B is used. The electromagnetic coupler 21 is formed by using a 1 mm thick FR 4 double sided copper foil printed board. Each dimension of the electromagnetic coupler 21 is shown in FIGS. 5A and 5B. This electromagnetic coupler 21 is fed by using a coaxial cable with a characteristic impedance of 50Ω, and for the 50Ω feed system 26, the reflection coefficient absolute value versus frequency characteristic of the electromagnetic coupler 21 is measured by using a network analyzer.

As shown in FIG. 6, the electromagnetic coupler 21 has the minimum reflection coefficient absolute value at a frequency of around 4.5 GHz, and operates around that frequency to act as the electromagnetic coupler. In the band of from 4.25 GHz to 4.75 GHz, the reflection coefficient absolute value is smaller than 0.7, and in this frequency band the outgoing to incoming antenna power ratio is not less than 50 percent. It is therefore found that the electromagnetic coupler 21 achieves the wide band frequency characteristic.

Figure 7:
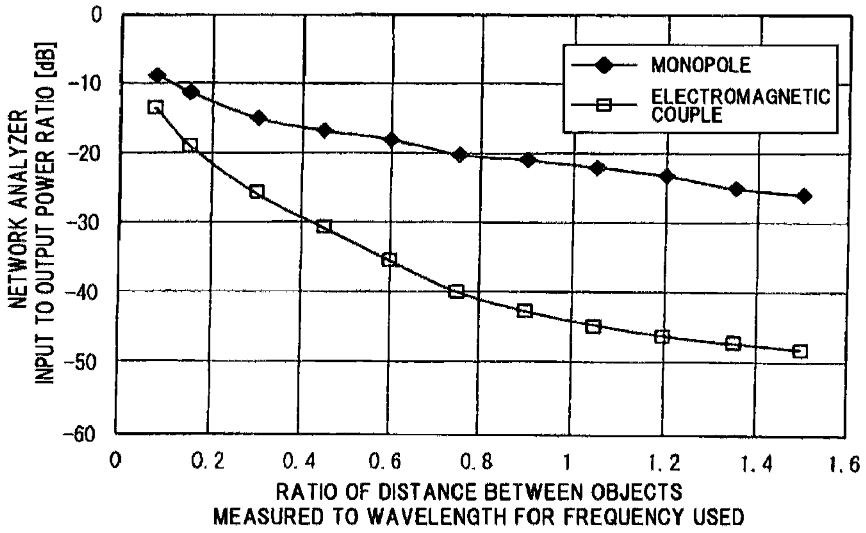
FIG. 7 is a graph showing experimental results of the electromagnetic coupler input to output power ratio versus the distance between the electromagnetic couplers shown in FIGS. 2A and 2B, and the monopole antenna input to output power ratio versus the distance between monopole antennas.
Figure 8:
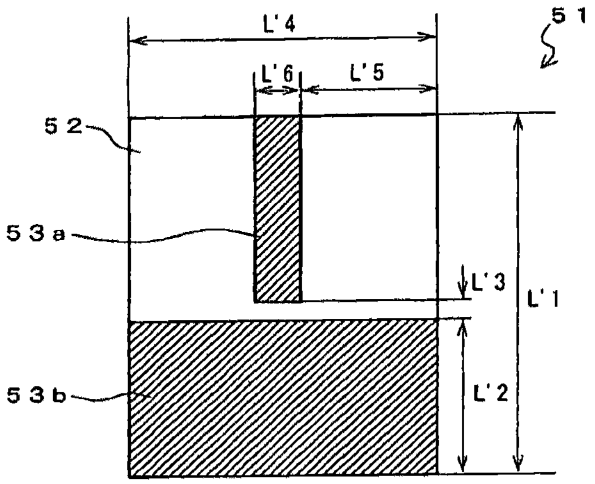
FIG. 8 is a plan view showing a monopole antenna used in the experiment of FIG. 7.

Referring also to FIG. 7, for the electromagnetic coupler 21 and a monopole antenna, there are shown experimental results of investigating the electromagnetic coupler 21 input to output power ratio versus the distance between the two electromagnetic couplers 21, and the monopole antenna input to output power ratio versus the distance between the two monopole antennas. In this experiment, the monopole antenna 51 as shown in FIG. 8 is used. The monopole antenna 51 comprises a printed board 52, and two rectangular conductors 53*a* and 53*b* formed on the surface of the printed board 52. The two rectangular conductors 53*a* and 53*b* are formed to be spaced apart from each other.

The rectangular conductor 53*a* acts as a radiating conductor, while the rectangular conductor 53*b* acts as ground. The monopole antenna 51 is fed between the rectangular conductors 53*a* and 53*b*. The monopole antenna 51 is formed by using a 2.4 mm thick FR 4 single sided board. In FIG. 8, L'1=22.0 mm, L'2=10.0 mm, L'3=1.0 mm, L'4=20.0 mm, L'5=9.5 mm, and L'6=1.0 mm. The monopole antenna 51 is commonly employed, and applied to wireless communications using transverse waves.

Figure 9:
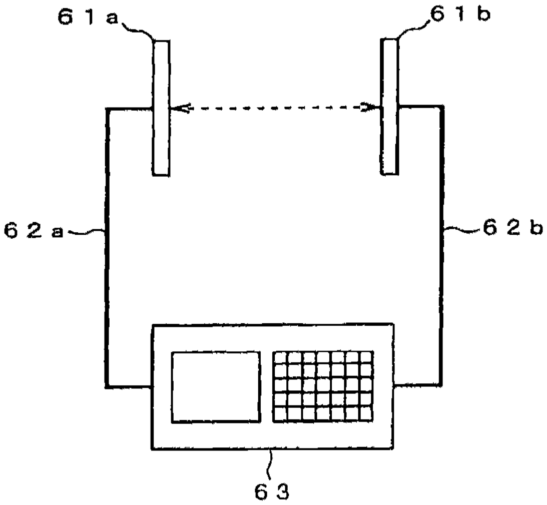
FIG. 9 is a diagram showing an experimental method for the experiment of FIG. 7.

Referring also to FIG. 9, its experiment system is described. In the experiment, the two objects 61*a* and 61*b* to be measured, i.e. the two electromagnetic couplers 21 or the two monopole antennas 51 are disposed opposite and parallel to each other so that a perpendicular through the center of one object 61*a* to be measured passes through the center of the other object 61*b* to be measured. The objects 61*a* and 61*b* to be measured are connected via coaxial cables 62*a* and 62*b* to two terminals respectively of one network analyzer 63. The ratio of power input from the other terminal to power output from one terminal of the network analyzer 63, i.e. the electromagnetic coupler 21 or monopole antenna 51 input to output power ratio (herein also referred to as "the S21 absolute value") is evaluated.

Referring again to FIG. 7, there are shown the experimental results of the relationships between the S21 absolute value and the distance between the two electromagnetic couplers 21 as shown in FIGS. 2A and 2B, and between the two monopole antennas 51 as shown in FIG. 8. In the experiment, a signal having a frequency of 4.5 GHz is used. The horizontal axis in FIG. 7 is the ratio of the distance between the objects 61*a* and 61*b* measured to the wavelength equivalent to that frequency used.

As seen from FIG. 7, since the electromagnetic coupler 21 according to the invention uses the longitudinal waves for wireless communication which attenuate more significantly with distance than the transverse waves, the electromagnetic coupler 21 has the larger gradient of the S21 absolute value versus the distance than the monopole antenna 51 using the transverse waves for wireless communication.

Specifically, the difference in the input to output power ratio between when the ratio of the distance between the objects 61*a* and 61*b* measured to the wavelength is approximately 0.07 and when that ratio is approximately 1.5 is approximately 18 dB for the monopole antenna 51, whereas the input to output power ratio difference therebetween is approximately 30 dB for the electromagnetic coupler 21 according to the invention. It is therefore found that, with the electromagnetic coupler 21 according to the invention, the wireless communication strength is weak at relatively long distances, and the electromagnetic coupler 21 is therefore suitable for short distance wireless communication.

Also, to verify that the coupling range is enlarged by adding the second element 7 not to be fed, for the electromagnetic coupler 21 as shown in FIGS. 2A and 2B, and an electromagnetic coupler resulting from removal of the second element 7 from the electromagnetic coupler 21 as shown in FIGS. 2A and 2B (herein referred to as "comparative example electromagnetic coupler"), their respective coupling strengths are measured and compared.

The coupling strengths are measured by using the evaluation system of FIG. 9 and measuring the S21 absolute value. Specifically, the S21 absolute value at a frequency of 4.5 GHz is measured by arranging the two electromagnetic couplers 21 or the two comparative example electromagnetic couplers opposite each other so that their respective centers are aligned with each other and the distance therebetween is 3 mm, and moving the position of the other electromagnetic coupler 21 or comparative example electromagnetic coupler relative to one electromagnetic coupler 21 or comparative example electromagnetic coupler, perpendicularly to a straight line connecting both their respective centers. Incidentally, the measurement position is set at 0 mm when the respective centers of the two opposing electromagnetic couplers 21 or comparative example electromagnetic couplers are aligned with each other. Its results measured are shown in FIG. 10.

Figure 10:
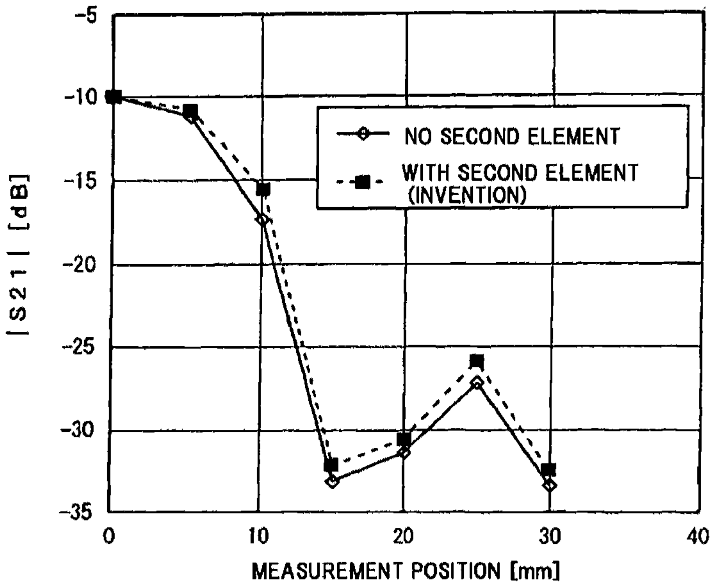
FIG. 10 is graphs showing experimental results of the relationship between the measurement position and the S21 absolute value in the electromagnetic coupler shown in FIGS. 2A and 2B and an electromagnetic coupler in a comparative example in which a second element is removed from the electromagnetic coupler shown in FIGS. 2A and 2B.

As shown in FIG. 10, in the electromagnetic coupler 21 according to the invention, the S21 absolute value is at least large at measurement positions of 10 to 30 mm by the order of about 1 to 2 dB, in comparison with the comparative example electromagnetic coupler having no second element 7. It is therefore found that the electromagnetic coupler 21 allows its coupling range to be enlarged by arranging the second element 7.

As described above, the electromagnetic coupler 21 in the first embodiment includes the plural conductive patterns 2 formed on the first plane and spaced apart from each other, the ground pattern 3 formed on the second plane parallel to the first plane and connected to ground, the first linear conductor 4 formed perpendicularly to the first and the second plane, formed to have a length shorter than ¼ the wavelength equivalent to the frequency used, connected at one end to one conductive pattern 2*d* of the plural conductive patterns 2, and fed between the other end of the first linear conductor 4 and the ground pattern 3, and the plural second linear conductors 5 formed perpendicularly to the first and the second plane, and formed to have a length shorter than ¼ the wavelength equivalent to the frequency used, one or more of the second linear conductors 5 being formed for each of the plural conductive patterns 2, for connecting each of the plural conductive patterns 2 and the ground pattern 3.

That is, the electromagnetic coupler 21 in the first embodiment is structured to include, in addition to the first element 6 comprising the first linear conductor 4, the conductive pattern 2*d*, and the second linear conductors 5, the second element 7 comprising the conductive pattern 2*e* and the second linear conductors 5.

The conventional electromagnetic coupler is provided with only one electrode (i.e. the first element 6) as the source for radiating longitudinal wave components of electromagnetic waves, and the enlargement of its electrode size (i.e. conductive pattern 2*d* size) causes variation in operating frequency. Its electromagnetic coupling range is therefore limited to some degree if the power input to the electromagnetic coupler is constant.

In contrast, the electromagnetic coupler 21 in the first embodiment includes the second element 7 not connected to the feed system 26, and the longitudinal wave components of the electromagnetic waves, which are employed for wireless communication limited to short distance, are radiated from the second linear conductors 5, respectively, constituting the second element 7. Therefore, the wide range arrangement of the second linear conductors 5 of the second element 7 allows the wide range radiation of the longitudinal wave components of the electromagnetic waves. Thus, the electromagnetic coupler 21 having its wide coupling range in comparison with the conventional electromagnetic coupler is feasible. Also, the addition of the second element 7 allows no variation in operating frequency of the first element 6. It is therefore possible to enlarge the coupling range without variation in operating frequency.

Further, since the electromagnetic coupler 21 is formed with the plural second linear conductors 5 which are the sources of the longitudinal waves, even when the magnitude of the electromagnetic wave produced in each second linear conductor 5 is small due to flattening of the electromagnetic coupler 21, it is possible to maintain the magnitude of the electromagnetic waves produced in the entire electromagnetic coupler 21, and maintain its high coupling strength. Thus, the electromagnetic coupler 21 can, even when flattened, achieve its greater coupling range while maintaining its coupling strength equivalent to the conventional coupling strength. Thus, even when the transmitter electromagnetic coupler 21 and the receiver electromagnetic coupler 21 are slightly misaligned relative to each other, the information transmission therebetween is possible. This contributes to enhancement in convenience.

Also, since the second linear conductors 5 constituting the first element 6 act as the shorting stubs, the electromagnetic coupler 21 can, even when flattened, make its impedance characteristic change gradual, and thereby widen its frequency band used.

Further, the second linear conductors 5 act as the shorting stubs. In comparison with the open stub, in order to achieve its similar matching condition, it is therefore necessary to enlarge the size of the conductive pattern 2*d* constituting the first element 6 (herein, set the length of one side thereof at 225λ/1000 to 450λ/1000), and increase the distance between the first linear conductor 4 and the second linear conductors 5 (herein, set at 75λ/1000 to 225λ/1000). That is, the electromagnetic coupler 21 can increase the distance between the first linear conductor 4 and the second linear conductors 5 in the first element 6, and thereby widen its coupling range.

Also, because the electromagnetic coupler 21 is formed with the second linear conductors 5 constituting the first element 6 at such positions respectively as to have a point symmetry with respect to the first linear conductor 4, the transverse waves resulting from the electric currents flowing in the conductive pattern 2*d* cancel each other out. The electromagnetic coupler 21 can therefore suppress the occurrence of the transverse waves including the radiation electric field. Further, because the electromagnetic coupler 21 is formed with the second linear conductors 5 constituting the second element 7 at such positions respectively as to have a point symmetry with respect to the first linear conductor 4, and have a point symmetry with respect to the symmetry point of the conductive pattern 2*e*, the transverse waves resulting from the electric currents flowing in the conductive pattern 2*e* also cancel each other out. Further, the electromagnetic coupler 21 can be flattened, and therefore also suppress the transverse waves produced in the second linear conductors 5. Incidentally, as seen by comparison of previously mentioned Formulae (1) and (2), the magnitude of the transverse waves is ½ the magnitude of the longitudinal waves, and therefore when the electromagnetic coupler 21 is flattened (the second linear conductors 5 are shortened), the transverse waves are very small. Thus, it is possible to realize the electromagnetic coupler 21, which is suitable for short distance wireless communication, so as not to interfere with any other wireless communication systems.

Further, the electromagnetic coupler 21 can reduce the previously mentioned degradation in the information transmission characteristics due to the variation in the permittivity between the electromagnetic couplers 21, because of no use of the bandpass filter structure as in the prior art. That is, the invention can realize the electromagnetic coupler 21, whose information transmission characteristics are substantially unaffected by the variation in the permittivity between it and the other electromagnetic coupler 21 performing the information transmission. Consequently, even when the electromagnetic coupler 21 is built into a device with a cover including a dielectric, the electromagnetic coupler 21 can reduce the degradation in the information transmission characteristics, and is therefore easily adapted to many more kinds of information communication devices.

Incidentally, the conventional electromagnetic coupler requires the electrode, the series inductor, the parallel inductor, and the capacitance in order to realize the bandpass filter, and also the electrode is structured to be arranged for a layer independent of the series inductor and the ground pattern. One method to materialize this is to form the series and parallel inductors on the surface of a double layer printed board, and the ground pattern on the reverse of the double layer printed board, and to further connect another electrode thereto. Also, another method is to use a triple layer printed board, form the electrode, the series and parallel inductors, and the ground pattern for the layers respectively, and connect the electrode and the inductors by means of linear conductors. However, these methods make the electromagnetic coupler complicated in structure, and also high in cost. In contrast, the invention can realize the electromagnetic coupler 21 by use of the double layer printed board 22, such as an FR 4—interposed printed board. Accordingly, the invention can realize the electromagnetic coupler 21, which is simple in structure, and low in cost.

Also, the invention allows the design of the electromagnetic coupler 21 without taking account of the realization of the bandpass filter, and can therefore facilitate its feed system 26 matching adjustment with its information transmission characteristics being maintained to be equivalent to conventional information transmission characteristics. Accordingly, when the electromagnetic coupler 21 is mounted on a device, although the frequency characteristic of the electromagnetic coupler 21 needs to be adjusted according to the space or ambient environment to arrange the electromagnetic coupler 21, because it is possible to facilitate its feed system 26 matching adjustment, it is possible to reduce the time necessary for this frequency adjustment, and thereby promptly provide the optimal electromagnetic coupler 21.

Second Embodiment

Figure 11A:
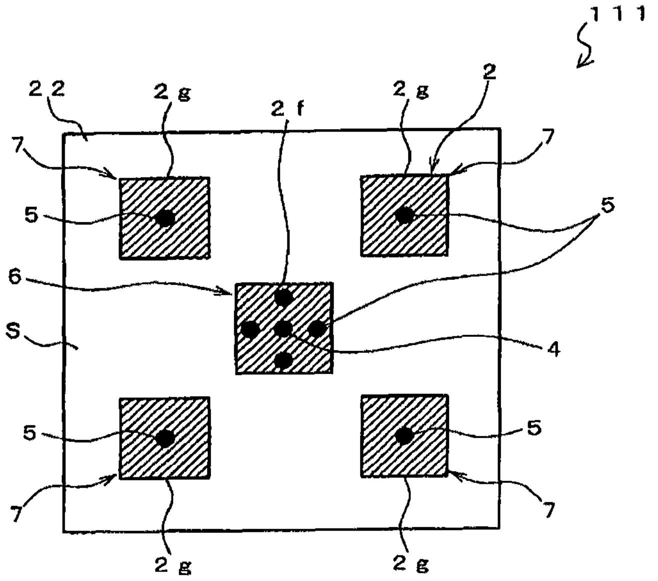
FIG. 11A is a plan view showing an electromagnetic coupler in a second embodiment according to the invention, when viewed from a surface side thereof.
Figure 11B:
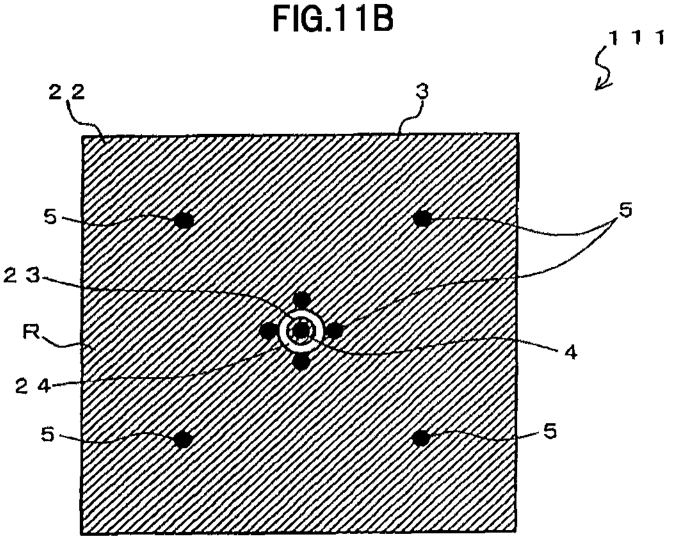
FIG. 11B is a plan view showing the electromagnetic coupler of FIG. 11A, when the reverse side thereof is seen through from the surface side thereof.

Referring to FIGS. 11A and 11B, an electromagnetic coupler 111 in a second embodiment according to the invention is described next.

The electromagnetic coupler 111 as shown in FIGS. 11A and 11B is formed with four second elements 7 around a first element 6 to be fed. Incidentally, although herein the number of second elements 7 formed is described as being four, the number of second elements 7 is not limited thereto.

In the second embodiment, the first element 6 comprises a conductive pattern (first conductive pattern) 2*f*, which is square in the plan view, formed in a middle portion of a surface S of a printed board 22, a first linear conductor 4 connected to the center of a feed pattern 23 at one end, and to the center of the conductive pattern 2*f* at the other end, and four second linear conductors 5 for electrically connecting the conductive pattern 2*f* and a ground pattern 3. The four second linear conductors 5 are formed at such positions respectively as to have a point symmetry with respect to the first linear conductor 4 in the plan view, and are arranged at such positions respectively as to quarter the circumference of a concentric circle having the first linear conductor 4 at its center in the plan view (in FIG. 11A, at the upper, lower, left and right positions respectively of the first linear conductor 4). Incidentally, the shape of the conductive pattern 2*f* of the first element 6, the number of second linear conductors 5, the positions to form the second linear conductors 5, etc. are not limited thereto, but the shape of the conductive pattern 2*f*, for example, may be circular, elliptic, or the like. An appropriate selection of the shape of the conductive pattern 2*f* or the positions of the second linear conductors 5 formed for the conductive pattern 2*f* allows the realization of the electromagnetic coupler 111 having the desired frequency characteristic.

The second elements 7 comprises a conductive pattern (second conductive pattern) 2*g* which is square in the plan view, and one second linear conductor 5 connected to the ground pattern 3 at one end, and to the center of the conductive pattern 2*g* at the other end. Incidentally, the shape of the conductive pattern 2*g* of the second elements 7, the number of second linear conductors 5, the positions to form the second linear conductors 5, and so on are not limited thereto. It should be noted, however, that, from the point of view of the suppression of the occurrence of the transverse waves, it is desirable that the conductive pattern 2*g* be shaped to have a point symmetry, and that the second linear conductors 5 be formed at such positions respectively as to have a point symmetry with respect to the symmetry point of the conductive pattern 2*g*.

The four second elements 7 are arranged in such a manner as to arrange the centers of their conductive patterns 2*g* at such positions respectively as to quarter the circumference of a concentric circle having the first linear conductor 4 at its center in the plan view (in FIG. 11A, at the right upper, right lower, left upper and left lower positions respectively of the first linear conductor 4). This allows all the second linear conductors 5 to be formed at such positions as to have a point symmetry with respect to the first linear conductor 4, ensure the symmetry of the entire electromagnetic coupler 111, and thereby suppress the occurrence of the transverse waves the most.

Figure 12A:
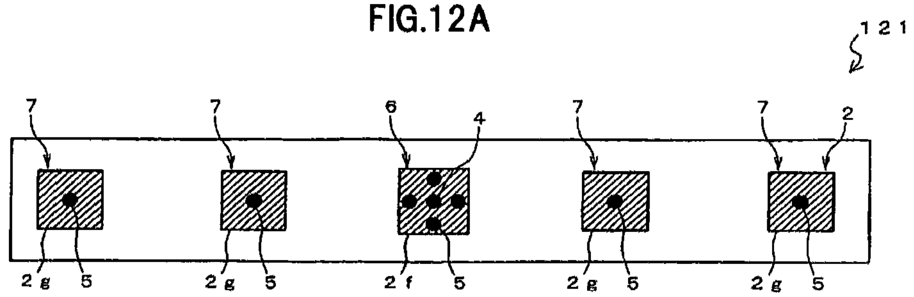
FIG. 12A is a plan view showing an electromagnetic coupler in a modification to the second embodiment according to the invention, when viewed from a surface side thereof.
Figure 12B:
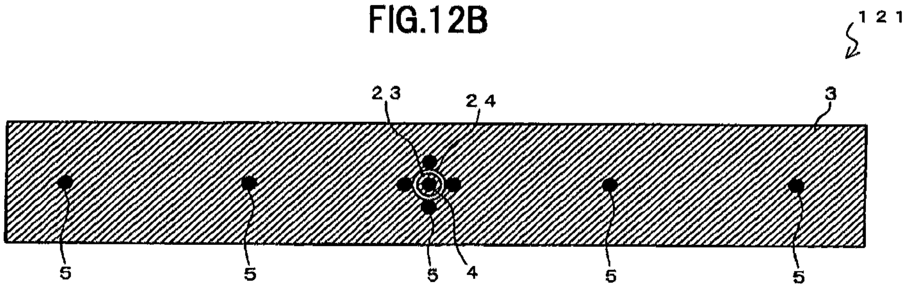
FIG. 12B is a plan view showing the electromagnetic coupler of FIG. 12A, when the reverse side thereof is seen through from the surface side thereof.

Incidentally, although in FIGS. 11A and 11B the four second elements 7 have been shown as being arranged at the right upper, right lower, left upper and left lower positions respectively of the first linear conductor 4, the conductive pattern 2*f* of the first element 6 and each of the conductive patterns 2*g* of the four second elements 7 may, as in an electromagnetic coupler 121 shown in FIGS. 12A and 12B, be aligned in a straight line (i.e. aligned in such a manner that the center in the plan view of the conductive pattern 2*f*, and the respective centers in the plan view of the conductive patterns 2*g* are aligned to form a straight line).

In the electromagnetic coupler 111 shown in FIGS. 11A and 11B, its coupling range widens in all directions from the first linear conductor 4 at its center, while in the electromagnetic coupler 121 as shown in FIGS. 12A and 12B, its coupling range can widen in only one direction (in the figures, the left and right direction), and thereby be horizontally long. In this manner, the suitable selection of the arrangement or positions of the second elements 7 allows the desired coupling range.

Third Embodiment

Referring to FIGS. 13 to 15B, an electromagnetic coupler 131 in a third embodiment according to the invention is described next.

Figure 13:
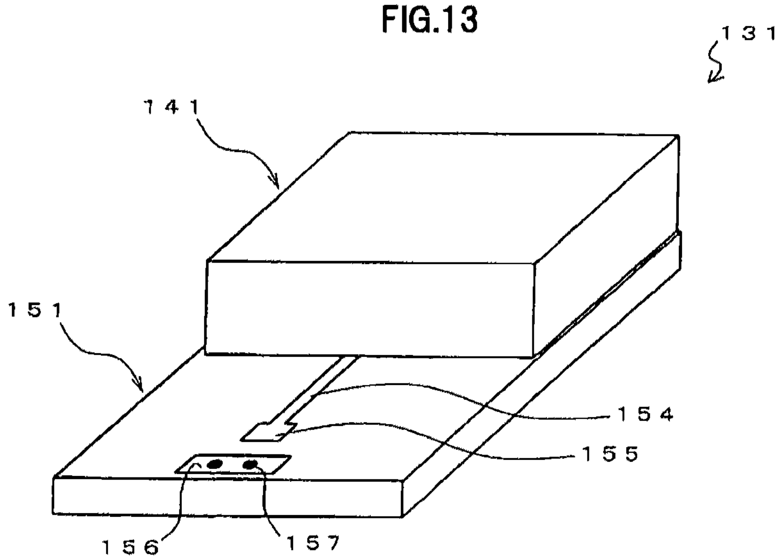
FIG. 13 is a perspective view showing an electromagnetic coupler in a third embodiment according to the invention.
Figure 14A:
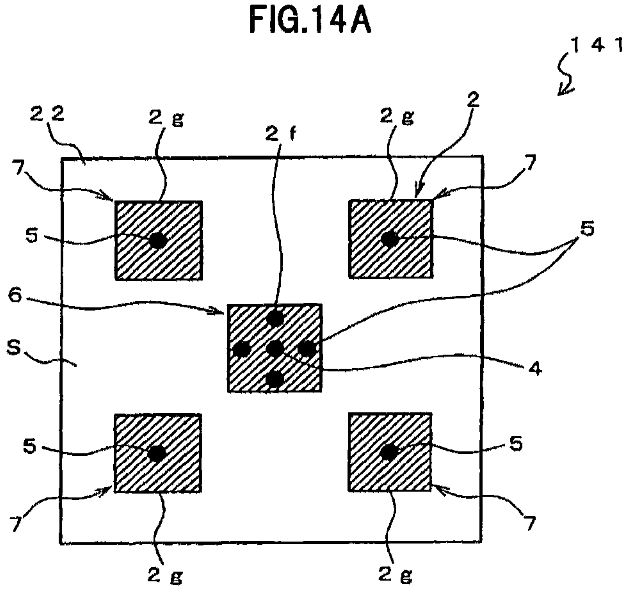
FIG. 14A is a plan view showing an electromagnetic coupler portion used in the electromagnetic coupler in the third embodiment according to the invention, when viewed from a surface side thereof.
Figure 14B:
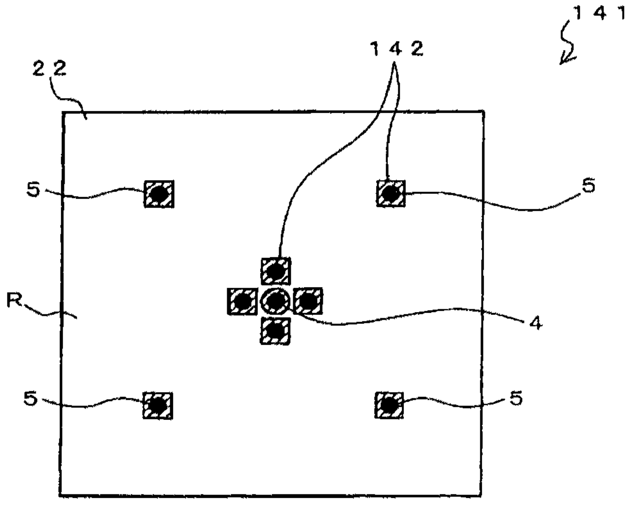
FIG. 14B is a plan view showing the electromagnetic coupler portion of FIG. 14A, when the reverse side thereof is seen through from the surface side thereof.
Figure 15A:
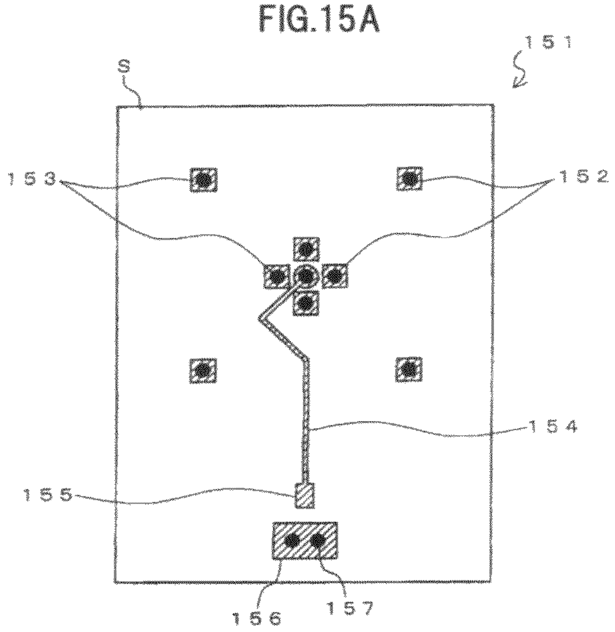
FIG. 15A is a plan view showing a feed printed board used in the electromagnetic coupler in the third embodiment according to the invention, when viewed from a surface side thereof.
Figure 15B:
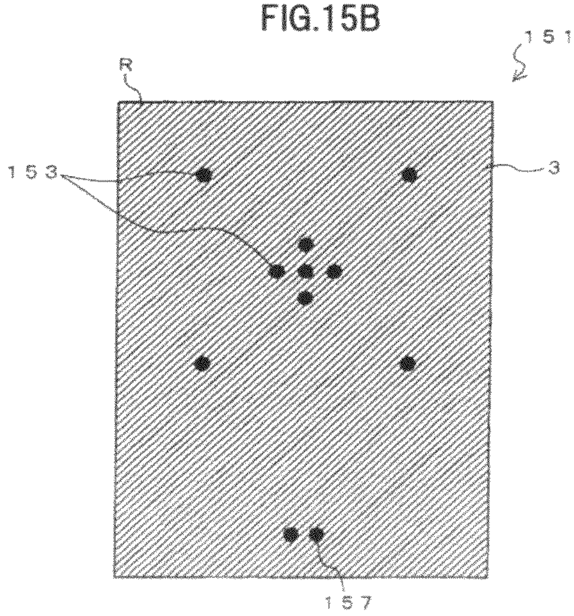
FIG. 15B is a plan view showing the feed printed board of FIG. 15A, when the reverse side thereof is seen through from the surface side thereof.

The electromagnetic coupler 131 shown in FIG. 13 uses a ground conductor of a feed printed board 151 as the ground pattern 3, and is constructed by overlapping an electromagnetic coupler portion 141 as shown in FIGS. 14A and 14B on the feed printed board 151 as shown in FIGS. 15A and 15B.

As shown in FIGS. 14A and 14B, the electromagnetic coupler portion 141 results from removal of the ground pattern 3 from the electromagnetic coupler 111 shown in FIGS. 11A and 11B. The reverse surface R of the printed board 22 is formed with nine element side connection electrodes 142 to be electrically connected with the linear conductors 4 and 5 respectively. Incidentally, although herein the element side connection electrode 142 connected with the first linear conductor 4 is formed in a circular shape in the plan view and the element side connection electrodes 142 connected with the second linear conductors 5 respectively are formed in a square shape in the plan view, the shapes of the element side connection electrodes 142 are not limited thereto. Also, although herein the electromagnetic coupler portion 141 has been shown as having substantially the same structure as the electromagnetic coupler 111 shown in FIGS. 11A and 11B as one example, the structure of the electromagnetic coupler portion 141 is not limited thereto, but may be similar to the structure of the electromagnetic coupler 21 shown in FIGS. 2A and 2B, for example.

As shown in FIGS. 13, 15A and 15B, the feed printed board 151 is formed in such a rectangular shape in the plan view that the length of its short sides is substantially equal to (slightly longer than) the length of one side of the square printed board 22 constituting the electromagnetic coupler portion 141, while the length of its long sides is longer than the length of one side of the square printed board 22.

The reverse surface R of the feed printed board 151 is formed with a conductive pattern (ground conductor) to serve as the ground pattern 3. The surface S of the feed printed board 151 is formed with nine ground side connection electrodes 152 to be connected with the nine element side connection electrodes 142 respectively formed on the reverse surface R of the electromagnetic coupler portion 141. These nine ground side connection electrodes 152 are formed to be positioned at one end in the long side direction (in FIG. 15A, in the upper side) of the feed printed board 151. Each ground side connection electrode 152 and the ground pattern 3 are electrically connected together by linear conductors 153 (formed inside through holes), respectively.

Also, the surface S of the feed printed board 151 is formed with a wiring pattern 154 which extends from the ground side connection electrodes 152 connected with the first linear conductor 4, to the other end in the long side direction (in FIG. 15A, in the lower side) of the feed printed board 151, and a tip of the wiring pattern 154 is formed with a feed electrode 155 to be connected with a central conductor of a feeding coaxial cable not shown. The feed electrode 155 is formed in a portion in which the electromagnetic coupler portion 141 is not overlapped thereon when the electromagnetic coupler portion 141 is overlapped on the feed printed board 151.

Further, the other end relative to the feed electrode 155 of the surface S of the feed printed board 151 is formed with a ground electrode 156 spaced apart from the feed electrode 155 and to be connected with an outer conductor of the feeding coaxial cable not shown. The ground electrode 156 is electrically connected with the ground pattern 3 on the reverse surface R of the feed printed board 151 via two linear conductors 157 (formed inside through holes respectively).

The electromagnetic coupler 131 as shown in FIG. 13 is produced by overlapping the electromagnetic coupler portion 141 on the feed printed board 151, and electrically connecting the element side connection electrodes 142 and the ground side connection electrodes 152 respectively by means of solder, or the like.

Since the above described electromagnetic coupler 21 of FIGS. 2A and 2B, the electromagnetic coupler 111 of FIGS. 11A and 11B, and the electromagnetic coupler 121 of FIGS. 12A and 12B are fed by connecting the coaxial cable to the reverse surface R of the printed board 22 by means of soldering or the like, the printed board 22 has the protruding outer shape of the reverse surface R When the coaxial cable is connected thereto. For that, when the electromagnetic coupler 21, 111, or 121 is installed on an outer surface of e.g. a device (information communication device) flat in outer shape, it is necessary to provide a mount for fixing the electromagnetic coupler 21, 111, or 121. The height of the space to install the electromagnetic coupler 21, 111, or 121 is therefore the sum of the height of the electromagnetic coupler 21, 111, or 121 and the height of the mount. This may result in the height of the installation space being high.

In contrast, in the electromagnetic coupler 131 in the third embodiment, since the coaxial cable is connected to the surface S of the feed printed board 151, the reverse surface R of the feed printed board 151 which is the reverse surface of the electromagnetic coupler 131 can be flat. Consequently, it is possible to install the electromagnetic coupler 131 directly on the outer surface of the device (information communication device) flat in outer shape, and thereby make the height of the installation space low.

Fourth Embodiment

Figure 16A:
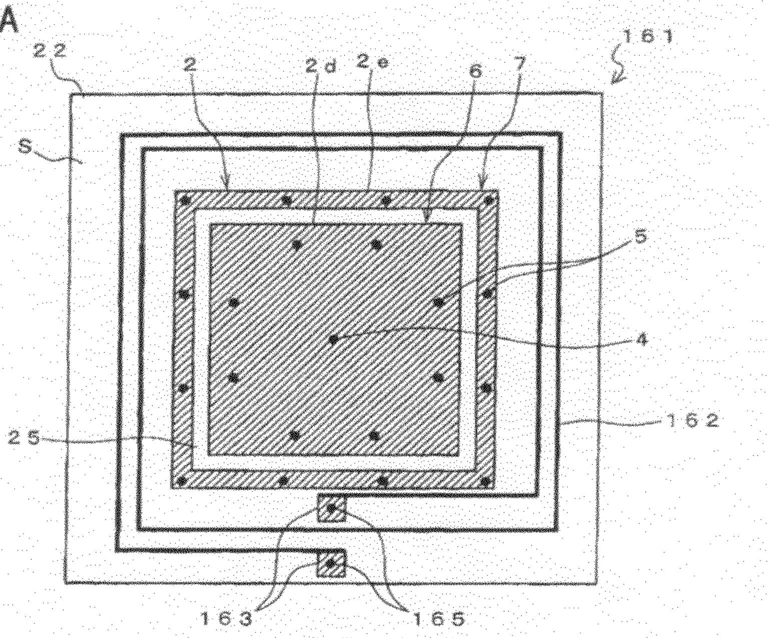
FIG. 16A is a plan view showing an electromagnetic coupler in a fourth embodiment according to the invention, when viewed from a surface side thereof.
Figure 16B:
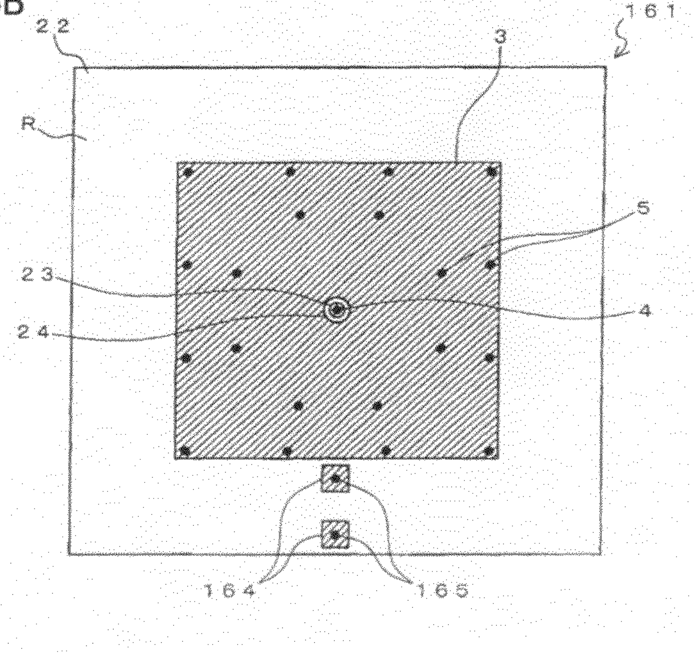
FIG. 16B is a plan view showing the electromagnetic coupler of FIG. 16A, when the reverse side thereof is seen through from the surface side thereof.

Referring to FIGS. 16A and 16B, an electromagnetic coupler 161 in a fourth embodiment according to the invention is described next.

The electromagnetic coupler 161 shown in FIGS. 16A and 16B uses a coil 162 to perform wireless communication by electromagnetic induction. The coil 162 is arranged to surround the conductive patterns 2*d* and 2*e* and the ground pattern 3 of the electromagnetic coupler 21 in the plan view of FIGS. 2A and 2B.

This embodiment is configured as follows: The surface S of the printed board 22 is formed with a wiring pattern to surround the conductive pattern 2*e* counterclockwise twice to form the coil 162. Two electrodes 163 formed at both ends of that wiring pattern, and two feed electrodes 164 formed on the reverse surface R of the printed board 22 are electrically connected together by linear conductors 165 (formed inside through holes), respectively.

The electromagnetic coupler 161 is fed between the two feed electrodes 164 by connecting therebetween a feed system different from a feed system for feeding between the feed pattern 23 and the ground pattern 3. The wiring pattern to form the coil 162 has an electrical length suitable for wireless communication by electromagnetic induction.

In this manner, the electromagnetic coupler 161 in the fourth embodiment is structured so that the further electromagnetic coupler using electromagnetic induction is arranged around the electromagnetic coupler 21 of FIGS. 2A and 2B. The operating frequency of the electromagnetic coupler 21 of FIGS. 2A and 2B is on the order of a few GHz as mentioned previously, while the operating frequency of the electromagnetic coupler using the coil 162 is on the order of e.g. 13 MHz, and these two electromagnetic couplers can be used for different applications, respectively. That is, the fourth embodiment can combine the two electromagnetic couplers used for different applications respectively, and thereby realize the packaged electromagnetic coupler 161. When the two electromagnetic couplers used for different applications respectively are mounted on one information communication device, both the electromagnetic couplers can therefore be assembled thereinto, to reduce the capacity occupied by them, and thereby reduce the size of the information communication device, or enhance the degree of freedom of design thereof.

The invention should not be limited to the above embodiments, but various alterations may, of course, be made without departing from the spirit and scope of the invention.

Although in the above embodiments it has been described that, for example the double layer printed board 22 is used so that its surface S is formed with the conductive patterns 2 while its reverse surface R is formed with the ground pattern 3 (or the element side connection electrode 142), the printed board is not limited thereto, but may use e.g. a triple or more layer printed board so that any two layers of the printed board may be used. Also, although in the above embodiments the use of the double layer printed board 22 has been shown, the printed board 22 may be not used, but a conductor plate formed of a conductor such as copper, iron or the like may be used to form the electromagnetic coupler.

What is claimed is:

1. An electromagnetic coupler, comprising:
a first plane;
a plurality of conductive patterns formed on the first plane and spaced apart from each other;
a second plane parallel to the first plane;
a ground pattern formed on the second plane and connected to ground;
a first linear conductor formed perpendicularly to the first plane and the second plane, and formed to have a length shorter than ¼ a wavelength equivalent to a frequency used, the first linear conductor being connected at one end to one conductive pattern of the plural conductive patterns, and fed between an other end of the first linear conductor and the ground pattern;
a plurality of second linear conductors formed perpendicularly to the first plane and the second plane, and formed to have a length shorter than ¼ the wavelength equivalent to the frequency used, one or more of the second linear conductors being formed for each of the plural conductive patterns, to connect each of the plural conductive patterns and the ground pattern; and
wherein the plural conductive patterns comprise a first conductive pattern, which is square in a plan view, connected with the first linear conductor, and a second conductive pattern, which is formed in a square frame shape in the plan view to surround the first conductive pattern.

2. The electromagnetic coupler according to claim 1, wherein
the first plane is one surface of a printed board,
the second plane is an other surface of the printed board, and
the first linear conductor and the second linear conductors are conductors formed inside through holes, respectively, formed in the printed board.

3. The electromagnetic coupler according to claim 1, wherein
the conductive pattern connected with the first linear conductor is formed in such a shape as to have a point symmetry with respect to a point connected with the first linear conductor, and
a plurality of the second linear conductors are connected at such positions respectively as to have a point symmetry with respect to the first linear conductor in a plan view, to the conductive pattern connected with the first linear conductor.

4. The electromagnetic coupler according to claim 1, wherein
the plural second linear conductors are formed at such positions respectively as to have a point symmetry with respect to the first linear conductor.

5. The electromagnetic coupler according to claim 1, wherein
the plural conductive patterns are formed in such a shape as to have a point symmetry, and
the plural second linear conductors are formed at such positions respectively as to have a point symmetry with respect to a symmetry point of the conductive patterns connected thereto.

6. An electromagnetic coupler, comprising:
a first plane;
a plurality of conductive patterns formed on the first plane and spaced apart from each other;
a second plane parallel to the first plane;
a ground pattern formed on the second plane and connected to ground;
a first linear conductor formed perpendicularly to the first plane and the second plane, and formed to have a length shorter than ¼ a wavelength equivalent to a frequency used, the first linear conductor being connected at one end to one conductive pattern of the plural conductive patterns, and fed between an other end of the first linear conductor and the ground pattern; and
a plurality of second linear conductors formed perpendicularly to the first plane and the second plane, and formed to have a length shorter than ¼ the wavelength equivalent to the frequency used, one or more of the second linear conductors being formed for each of the plural conductive patterns, to connect each of the plural conductive patterns and the ground pattern;
a coil to perform wireless communication by electromagnetic induction, the coil being arranged to surround the plural conductive patterns and the ground pattern in a plan view.

7. The electromagnetic coupler according to claim 1, further comprising
a coaxial cable for feeding between the other end of the first linear conductor and the ground pattern.

8. An information communication device to transmit information by use of at least one of an electrostatic field and an induction electric field, comprising
an electromagnetic coupler mounted thereon, the electromagnetic coupler comprising:
a first plane;
a plurality of conductive patterns formed on the first plane and spaced apart from each other;
a second plane parallel to the first plane;
a ground pattern formed on the second plane and connected to ground;
a first linear conductor formed perpendicularly to the first plane and the second plane, and formed to have a length shorter than ¼ a wavelength equivalent to a frequency used, the first linear conductor being connected at one end to one conductive pattern of the plural conductive patterns, and fed between an other end of the first linear conductor and the ground pattern; and
a plurality of second linear conductors formed perpendicularly to the first plane and the second plane, and formed to have a length shorter than ¼ the wavelength equivalent to the frequency used, one or more of the second linear conductors being formed for each of the plural conductive patterns, to connect each of the plural conductive patterns and the ground pattern.

9. The information communication device according to claim 8, wherein
the first plane is one surface of a printed board,
the second plane is an other surface of the printed board, and
the first linear conductor and the second linear conductors are conductors formed inside through holes, respectively, formed in the printed board.

10. The information communication device according to claim 8, wherein
the conductive pattern connected with the first linear conductor is formed in such a shape as to have a point symmetry with respect to a point connected with the first linear conductor, and
a plurality of the second linear conductors are connected at such positions respectively as to have a point symmetry with respect to the first linear conductor in a plan view, to the conductive pattern connected with the first linear conductor.

11. The information communication device according to claim 8, wherein
the plural second linear conductors are formed at such positions respectively as to have a point symmetry with respect to the first linear conductor.

12. The information communication device according to claim 8, wherein
the plural conductive patterns are formed in such a shape as to have a point symmetry, and
the plural second linear conductors are formed at such positions respectively as to have a point symmetry with respect to a symmetry point of the conductive patterns connected thereto.

13. The information communication device according to claim 8, wherein
the plural conductive patterns comprise a first conductive pattern, which is square in a plan view, connected with the first linear conductor, and a second conductive pattern, which is formed in a square frame shape in the plan view to surround the first conductive pattern.

14. The information communication device according to claim 8, wherein
the plural conductive patterns comprise a first conductive pattern connected with the first linear conductor, and a plurality of second conductive patterns formed around the first conductive pattern, and
the plural second conductive patterns are arranged at such positions respectively as to equally divide a circumference of a concentric circle having the first linear conductor at its center in its plan view as a reference point.

15. The information communication device according to claim 8, wherein
the plural conductive patterns comprise a first conductive pattern connected with the first linear conductor, and a plurality of second conductive patterns formed around the first conductive pattern, and
he first conductive pattern and the plural second conductive patterns are aligned in such a manner that the center in the plan view of the first conductive pattern as a reference point, and the respective centers in the plan view of the plural second conductive patterns as reference points are aligned to form a straight line.

16. The information communication device according to claim 8, further comprising
a coil to perform wireless communication by electromagnetic induction, the coil being arranged to surround the plural conductive patterns and the ground pattern in a plan view.

17. The information communication device according to claim 8, further comprising
a coaxial cable for feeding between the other end of the first linear conductor and the ground pattern.

* * * * *